(12) United States Patent
Xie et al.

(10) Patent No.: US 10,515,909 B2
(45) Date of Patent: Dec. 24, 2019

(54) DISPLAY APPARATUS AND FABRICATING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Xiaodong Xie, Beijing (CN); Ming Hu, Beijing (CN); Ming Zhang, Beijing (CN); Jing Wang, Beijing (CN); Shuncheng Zhu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 322 days.

(21) Appl. No.: 15/533,824

(22) PCT Filed: Jan. 13, 2017

(86) PCT No.: PCT/CN2017/071122
§ 371 (c)(1),
(2) Date: Jun. 7, 2017

(87) PCT Pub. No.: WO2017/215263
PCT Pub. Date: Dec. 21, 2017

(65) Prior Publication Data
US 2018/0190598 A1 Jul. 5, 2018

(30) Foreign Application Priority Data
Jun. 17, 2016 (CN) .......................... 2016 1 0431763

(51) Int. Cl.
H01L 23/60 (2006.01)
H01L 23/50 (2006.01)
G02F 1/1333 (2006.01)

(52) U.S. Cl.
CPC ............ *H01L 23/60* (2013.01); *G02F 1/1333* (2013.01); *H01L 23/50* (2013.01); *G02F 2202/22* (2013.01); *H01L 2224/01* (2013.01)

(58) Field of Classification Search
CPC ....... H01L 3/60; H01L 23/60; H01L 2224/01; G02F 1/1333; G02F 2202/22
(Continued)

(56) References Cited

U.S. PATENT DOCUMENTS

2005/0078232 A1* 4/2005 Lo ..................... G02F 1/136204
349/40
2012/0174359 A1 7/2012 Yang et al.
(Continued)

FOREIGN PATENT DOCUMENTS

CN 101763202 A 6/2010
CN 202815805 U 3/2013
(Continued)

OTHER PUBLICATIONS

International Search Report & Written Opinion dated Mar. 29, 2017 regarding PCT/CN2017/071122.
(Continued)

*Primary Examiner* — Zeev V Kitov
(74) *Attorney, Agent, or Firm* — Intellectual Valley Law, P.C.

(57) ABSTRACT

The present application discloses a display apparatus having a driver integrated circuit (IC) bonding area for bonding a plurality of signal lines with a driver IC. The display apparatus includes a conductive line layer in a peripheral
(Continued)

area of the display apparatus, configured to discharge electrostatic charge in the driver IC bonding area.

16 Claims, 4 Drawing Sheets

(58) Field of Classification Search
USPC .......................................................... 361/56
See application file for complete search history.

(56) References Cited

U.S. PATENT DOCUMENTS

2015/0162347 A1      6/2015  Yu et al.
2016/0155408 A1      6/2016  Lee et al.
2016/0365030 A1*   12/2016  Wu ...................... G09G 3/3258

FOREIGN PATENT DOCUMENTS

| CN | 103227173 A | 7/2013 |
| CN | 103399670 A | 11/2013 |
| CN | 105022520 A | 11/2015 |
| CN | 105655326 A | 6/2016 |

OTHER PUBLICATIONS

First Office Action in the Chinese Patent Application No. 201610431763.0, dated Dec. 25, 2017; English translation attached.

* cited by examiner

101

DISPLAY APPARATUS AND FABRICATING METHOD THEREOF

CROSS-REFERENCE TO RELATED APPLICATION

This application is a national stage application under 35 U.S.C. § 371 of International Application No. PCT/CN2017/071122 filed Jan. 13, 2017, which claims priority to Chinese Patent Application No. 201610431763.0, filed Jun. 17, 2016, the contents of which are incorporated by reference in the entirety.

TECHNICAL FIELD

The present invention relates to display technology, more particularly, to a display apparatus and a fabricating method thereof.

BACKGROUND

A printed circuit board is an important component of a display apparatus. Display apparatuses include a number of integrated circuits electrically connected to a display panel or a touch panel in the display apparatuses. Image display and touch control are driven by these integrated circuits. The integrated circuits can be mounted to the printed circuit board and the printed circuit board can be electrically connected to the display panel or the touch panel.

SUMMARY

In one aspect, the present invention provides a display apparatus having a driver integrated circuit (IC) bonding area for bonding a plurality of signal lines with a driver IC; the display apparatus comprising a conductive line layer in a peripheral area of the display apparatus, configured to discharge electrostatic charge in the driver IC bonding area.

Optionally, the display apparatus further comprises a signal line layer on a base substrate comprising a plurality of signal lines, terminals of which extend into the driver IC bonding area forming a plurality of bonding leads; the conductive line layer comprising a conductive line, at least a portion of which is on a side of the plurality of bonding leads distal to a display area of the display apparatus.

Optionally, a projection of the conductive line on the base substrate substantially surrounds that of the plurality of bonding leads.

Optionally, a portion of the conductive line crosses over and is insulated from a plurality of signal lines on a side of the plurality of bonding leads proximal to the display area.

Optionally, the conductive line layer comprising a conductive line; and the conductive line comprises at least one first discharging protrusions arranged along the conductive line.

Optionally, the display apparatus further comprises a charge storage unit coupled with the conductive line layer for storing electrostatic charges from the conductive line layer.

Optionally, the display apparatus further comprises at least one diodes; wherein the conductive line layer comprising a conductive line; the at least one diodes arranged along the conductive line; each of the at least one diodes connecting the conductive line to the charge storage unit; and the charge storage unit is configured to receive an output from the at least one diodes and to store charges received from the at least one diodes.

Optionally, the charge storage unit comprises at least one second discharging protrusions on a surface of the charge storage unit.

Optionally, the conductive line layer comprising a conductive line; the conductive line comprises at least one first discharging protrusions arranged along the conductive line; and the at least one second discharging protrusions are configured to receive electrostatic charges from the plurality of first discharging protrusions.

Optionally, the at least one first discharging protrusions and the at least one second discharging protrusions are in a same layer.

Optionally, the at least one first discharging protrusions and the at least one second discharging protrusions are in two different layers.

Optionally, the at least one second discharging protrusions are disposed respectively opposed to the at least one first discharging protrusions.

Optionally, the conductive line comprises a plurality of first discharging protrusions arranged along a longitudinal direction of the conductive line; the charge storage unit comprises a plurality of second discharging protrusions on the surface of the charge storage unit; and the plurality of second discharging protrusions are disposed respectively opposed to the plurality of first discharging protrusions.

Optionally, the charge storage unit has a cuboid shape; and the plurality of second discharging protrusions are on two long side surfaces of the charge storage unit.

Optionally, the charge storage unit is a capacitor.

Optionally, the display apparatus further comprises a gate line layer and a data line layer; wherein a first capacitive plate of the capacitor is in a same layer as the gate line layer; and a second capacitive plate of the capacitor is in a same layer as the data line layer.

Optionally, the charge storage unit is configured to charge a light emitting diode or a rechargeable battery cell.

Optionally, the at least one first discharging protrusions are at least one first discharging tips, and the at least one second discharging protrusions are at least one second discharging tips; and the at least one second discharging tips are disposed respectively opposed to the at least one first discharging tips.

Optionally, a distance between a pair of corresponding first discharging tip and second discharging tip is in a range of approximately 10 μm to approximately 20 μm.

Optionally, the conductive line layer is a conductive strip layer comprising a conductive strip.

Optionally, the conductive strip is a conductive adhesive strip.

Optionally, the conductive strip is a metal strip.

In another aspect, the present invention provides a method of fabricating a display apparatus having a driver integrated circuit (IC) bonding area for bonding a plurality of signal lines with a driver IC, comprising forming a conductive line layer in a peripheral area of the display apparatus, configured to discharge electrostatic charge in the driver IC bonding area.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
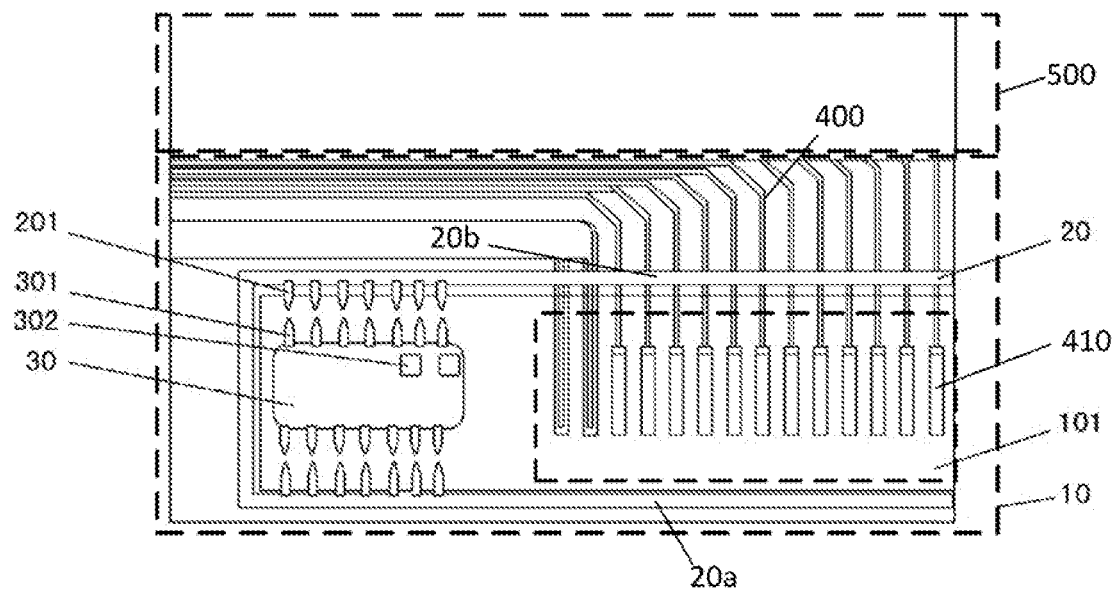
FIG. 1 is a zoom-in view of a driver integrated circuit bonding area of a display apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a display apparatus, a driver integrated circuit (IC) is bonded to a display substrate in a driver IC bonding area, e.g., using an anisotropic conductive film. The driver IC bonding area is prone to electrostatic damages in part because the bonding area is exposed to external environment. Also, in the process of assembling a printed circuit board having the driver IC onto the bonding area, the contacts between the printed circuit board and human hands or machines produce electrostatic charge, damaging the integrated circuit and the bonding leads in the bonding area.

Accordingly, the present invention provides, inter alia, a display apparatus and a fabricating method thereof that substantially obviate one or more of the problems due to limitations and disadvantages of the related art. In one aspect, the present disclosure provides a display apparatus having a conductive line layer in a peripheral area of the display apparatus, configured to discharge electrostatic charge in the driver IC bonding area. Optionally, the display apparatus includes a signal line layer on a base substrate comprising a plurality of signal lines, terminals of which extend into the driver IC bonding area forming a plurality of bonding leads. Optionally, the conductive line layer includes a conductive line, at least a portion of which is on a side of the plurality of bonding leads distal to a display area of the display apparatus. Optionally, the conductive line is configured to protect the bonding leads from electrostatic damages. When the display apparatus includes a printed circuit board bonded onto the bonding area, the conductive line is also configured to protect the integrated circuit in the printed circuit board from electrostatic damages.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

The signal line may be any appropriate signal line. Optionally, the plurality of signal lines are a plurality of data lines, and the driver IC is a data driver IC. Optionally, the plurality of signal lines are a plurality of gate lines, and the driver IC is a gate driver IC. Optionally, the plurality of signal lines are a plurality of touch control lines, and the driver IC is a touch control driver IC.

FIG. 1 is a zoom-in view of a driver integrated circuit bonding area of a display apparatus in some embodiments according to the present disclosure. Referring to FIG. 1, the display apparatus has a display area 500, a peripheral area 10, and a signal line layer including a plurality of signal lines 400 on a base substrate. In the peripheral area 10, various circuits and wires are provided to transmit signals to a substrate (e.g., a display substrate or a touch substrate) of the display apparatus. In the peripheral area 10, the display apparatus has a driver integrated circuit bonding area 101 in which a plurality of signal lines 400 are configured to bond with a driver integrated circuit (not shown in FIG. 1). Terminals of the plurality of signal lines extend from the display area 500 into the driver IC bonding area 101, forming a plurality of bonding leads 410.

In some embodiments, the display apparatus includes a conductive line layer including one or more conductive line 20 in the peripheral area 10 of the display apparatus. The conductive line layer according to the present disclosure is configured to discharge electrostatic charge in the driver IC bonding area 101. The conductive line in some embodiments may be a conductive strip. Optionally, the conductive strip is a metal strip. Optionally, the conductive strip is a conductive adhesive strip.

As shown in FIG. 1, in some embodiments, the conductive line 20 includes at least a first portion 20a on a side of the plurality of bonding leads 410 distal to a display area 500 of the display apparatus. Optionally, the display apparatus is a touch display apparatus, the plurality of signal lines are a plurality of touch signal lines, and the display area 500 substantially overlaps with a touch control area of the display apparatus. Optionally, the first portion 20a is on a side of the plurality of bonding leads 410 distal to a touch control area of the touch display apparatus.

In some embodiments, the conductive line 20 includes at least a second portion 20b that crosses over and is insulated from a plurality of signal lines 400 on a side of the plurality of bonding leads 410 proximal to the display area 500. Optionally, the display apparatus is a touch display apparatus, the plurality of signal lines are a plurality of touch signal lines, and the display area 500 substantially overlaps with a touch control area of the display apparatus. Optionally, the second portion 20b crosses over and is insulated from a plurality of signal lines 400 on a side of the plurality of bonding leads 410 proximal to the touch control area. Optionally, the display apparatus includes an insulating layer between the second portion 20b of the conductive line 20 and the plurality of signal lines 400.

As shown in FIG. 1, in some embodiments, the conductive line 20 includes at least a first portion 20a on a side of the plurality of bonding leads 410 distal to a display area 500 of the display apparatus, and at least a second portion 20b that crosses over and is insulated from a plurality of signal lines 400 on a side of the plurality of bonding leads 410 proximal to the display area 500. By including the first portion 20a and the second portion 20b, the conductive line 20 are disposed on two sides of the driver IC bonding area 101, effectively discharging electrostatic charge in the driver IC bonding area 101.

In some embodiments, a projection of the conductive line 20 on the base substrate substantially surrounds that of the plurality of bonding leads 410. For example, the conductive line 20 includes a first portion 20a and a second portion 20b, and further includes two portions each of which connecting the first portion 20a and the second portion 20b. Optionally, the conductive line 20 has a substantially ring shape (e.g., a closed ring or an open ring).

In some embodiments, the conductive line includes at least one first discharging protrusions arranged along the conductive line. Referring to FIG. 1, the conductive line 20 includes a plurality of first discharging protrusions 201 arranged along the longitudinal direction of the conductive line 20. The first discharging protrusions 201 may be in a same layer as the conductive line 20, e.g., formed in a same process using a same material. Optionally, the first discharging protrusions 201 is in a layer different from the conductive line 20, e.g., the first discharging protrusions 201 and the conductive line 20 are formed in different processes. Optionally, the first discharging protrusions 201 are a plurality of first discharging tips having a sharp terminal.

Referring to FIG. 1, the display apparatus in some embodiments further includes a charge storage unit 30 in the peripheral area coupled with the conductive line layer for storing electrostatic charges from the conductive line layer. The charge storage unit 30 may be a capacitor. Examples of charge storage unit 30 include, but are not limited to, a PN junction capacitor, a MOS capacitor, a parallel plate capacitor formed by sandwiching a dielectric between polysilicon.

In some embodiments, the charge storage unit includes at least one second discharging protrusions on a surface of the charge storage unit. Optionally, the at least one second discharging protrusions are configured respectively to receive electrostatic charges from the plurality of first discharging protrusions. Referring to FIG. 1, the charge storage unit 30 in some embodiments includes a plurality of second discharging protrusions 301 on the surface of the charge storage unit 30. The plurality of second discharging protrusions 301 are configured to respectively receive electrostatic charges from the plurality of first discharging protrusions 201. Optionally, the second discharging protrusions 301 are a plurality of second discharging tips having a sharp terminal.

In some embodiments, the at least one second discharging protrusions are disposed respectively opposed to the at least one first discharging protrusions. When there are more than one discharging tips, the plurality of second discharging protrusions are disposed respectively opposed to the plurality of first discharging protrusions, e.g., in a one-to-one relationship. In one example, the discharging protrusions are discharging tips, the plurality of second discharging tips are disposed respectively opposed to the plurality of first discharging tips. Apexes of tips of a pair of corresponding first discharging tip and second discharging tip are opposed to each other. Optionally, the at least one first discharging protrusions and the at least one second discharging protrusions are in a same layer. Optionally, the at least one first discharging protrusions and the at least one second discharging protrusions are in two different layers.

Referring to FIG. 1, the charge storage unit 30 in some embodiments has a cuboid shape. the plurality of second discharging protrusions 301 are disposed on two long side surfaces of the charge storage unit 30. Optionally, the second discharging protrusions 301 are disposed on one side surface of the charge storage unit 30. Optionally, the second discharging protrusions 301 are disposed on two adjacent side surfaces of the charge storage unit 30. As shown in FIG. 1, the conductive line 20 includes a plurality of first discharging protrusions 201 along the first portion 20a and a plurality of second discharging protrusions 201 along the second portion 20b. The plurality of first discharging protrusions 201 along the first portion 20a are disposed respectively opposed to the plurality of second discharging protrusions 301 on a first long side surface of the charge storage unit 30. The plurality of first discharging protrusions 201 along the second portion 20b are disposed respectively opposed to the plurality of second discharging protrusions 301 on a second long side surface of the charge storage unit 30.

In some embodiments, the display apparatus further includes a component configured to be charged by the charge storage unit. Examples of appropriate components to be charged by the charge storage unit include, but are not limited to, a light emitting diode and a rechargeable battery cell. Referring to FIG. 1, the charge storage unit 30 in some embodiments includes one or more terminals 302 (e.g., points of contact) configured to be coupled to a rechargeable battery cell for charging the rechargeable battery cell.

Figure 2A:
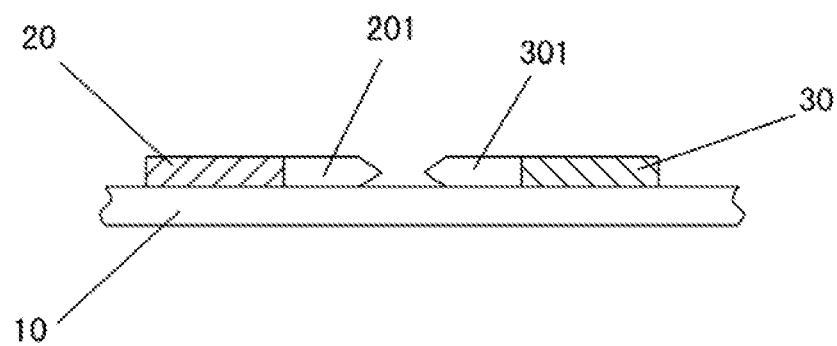
FIGS. 2A and 2B are schematic diagrams illustrating the structure of a pair of first discharging protrusion and second discharging protrusion in some embodiments according to the present disclosure.
Figure 2B:
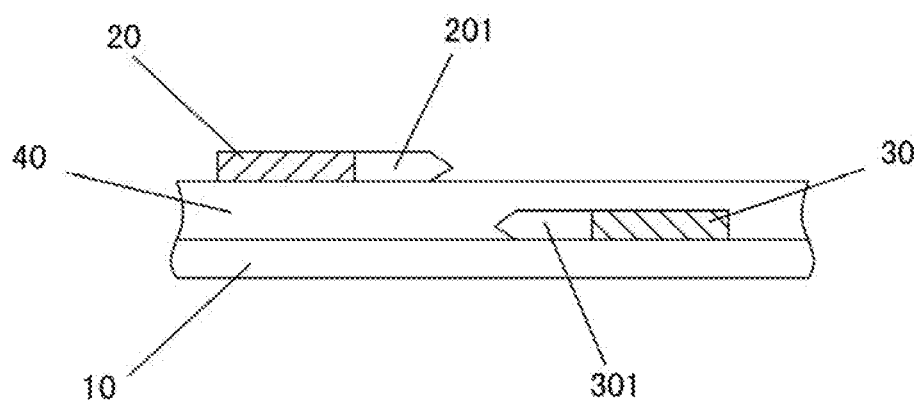

FIGS. 2A and 2B are schematic diagrams illustrating the structure of a pair of first discharging protrusion and second discharging protrusion in some embodiments according to the present disclosure. Referring to FIG. 2A, the at least one first discharging protrusions 201 and the at least one second discharging protrusions 301 are in a same layer. A pair of corresponding first discharging protrusion 201 and second discharging protrusion 301 are spaced apart by a gap. For example, the apexes of tips of a pair of corresponding first discharging protrusion 201 and second discharging protrusion 301 are spaced apart by a gap. Referring to FIG. 2B, the at least one first discharging protrusions 201 and the at least one second discharging protrusions 301 are in two different layers. The display apparatus further includes an insulating layer 40 between the first discharging protrusions 201 and the at least one second discharging protrusions 301. The insulating layer 40 insulates the first discharging protrusions 201 from the at least one second discharging protrusions 301.

In some embodiments, the conductive line 20 conducts the electrostatic charge in the driver IC bonding area along the conductive line 20, and diverts to the electrostatic charge to the charge storage unit 30. The electrostatic charge is diverted from the first discharging protrusion 201 in the conductive line layer to the second discharging protrusion 301 in the charge storage unit 30, e.g., by point discharge. The first discharging protrusions 201 and the second discharging protrusions 301 are spaced apart by a gap, and optionally separated by an insulating layer. Optionally, the first discharging protrusions 201 and the second discharging protrusions 301 are a plurality of first discharging tips and a plurality of second discharging tips. Optionally, a distance between a pair of corresponding first discharging tip and second discharging tip is in a range of approximately 10 μm to approximately 20 μm.

Figure 3:
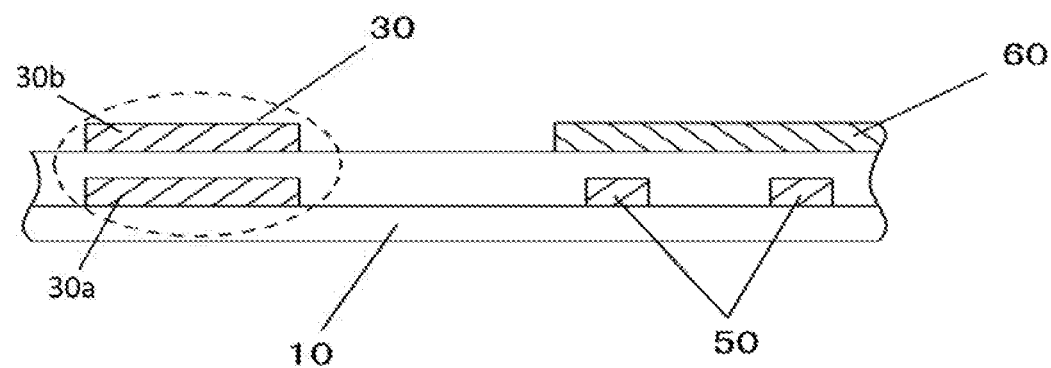
FIG. 3 is a schematic diagram illustrating the structure of a charge storage unit in some embodiments according to the present disclosure.

FIG. 3 is a schematic diagram illustrating the structure of a charge storage unit in some embodiments according to the present disclosure. Referring to FIG. 3, the charge storage unit 30 in some embodiments is a capacitor. The capacitor includes a first capacitive plate 30a and a second capacitive plate 30b. The display apparatus includes a gate line layer having a plurality of gate lines 50 and a data line layer having a plurality of data lines 60. Optionally, the first capacitive plate 30a and the gate line layer are in a same layer, e.g., formed in a same process and using a same material. Optionally, the second capacitive plate 30b and the data line layer are in a same layer, e.g., formed in a same process and using a same material.

In another aspect, the present disclosure provides a method of fabricating a display apparatus having a driver integrated circuit bonding area for bonding a plurality of signal lines with a driver IC. In some embodiments, the method includes forming a conductive line layer in a peripheral area of the display apparatus, configured to discharge electrostatic charge in the driver IC bonding area.

Optionally, the method further includes forming a signal line layer on a base substrate including a plurality of signal lines, terminals of which are formed to extend into the driver IC bonding area thereby forming a plurality of bonding leads.

Optionally, the step of forming the conductive line layer includes forming a conductive line, at least a portion of which is formed on a side of the plurality of bonding leads distal to a display area of the display apparatus. Optionally, the conductive line is formed so that a projection of the conductive line on the base substrate substantially surrounds that of the plurality of bonding leads. Optionally, a portion of the conductive line is formed to cross over a plurality of signal lines on a side of the plurality of bonding leads proximal to the display area. Optionally, the portion of the conductive line crossing over the plurality of signal lines on a side of the plurality of bonding leads proximal to the display area is formed to be insulated from the plurality of signal lines.

Optionally, the step of forming the conductive line layer includes forming at least one first discharging protrusions along the conductive line.

Optionally, the method further includes forming a charge storage unit in the peripheral area. The charge storage unit is formed to be coupled with the conductive line layer for storing electrostatic charges from the conductive line layer.

Optionally, the step of forming the charge storage unit further includes forming at least one second discharging protrusions on a surface of the charge storage unit. The at least one second discharging protrusions are configured to receive electrostatic charges from the plurality of first discharging protrusions.

Optionally, the at least one first discharging protrusions and the at least one second discharging protrusions are formed in a same layer. Optionally, the at least one first discharging protrusions and the at least one second discharging protrusions are in two different layers.

Optionally, the at least one second discharging protrusions are formed to be respectively opposed to the at least one first discharging protrusions. When more than one discharging tips are formed, optionally, a plurality of second discharging protrusions are formed to be respectively opposed to a plurality of first discharging protrusions.

Optionally, the step of forming the charge storage unit includes forming a cuboid-shaped charge storage unit, and forming the plurality of second discharging protrusions on two long side surfaces of the charge storage unit.

Optionally, the step of forming the charge storage unit includes forming a capacitor having a first capacitive plate and a second capacitive plate. The method further includes forming a gate line layer including a plurality of gate lines and forming a data line layer including a plurality of data lines. Optionally, the step of forming the gate line layer includes forming the plurality of gate lines and the first capacitive plate in a same layer. Optionally, the step of forming the data line layer includes forming the plurality of data lines and the second capacitive plate in a same layer.

Optionally, the method further includes forming a component coupled to the charge storage unit and configured to be charged by the charge storage unit. Optionally, the method includes forming a light emitting diode configured to be charged by the charge storage unit. Optionally, the method includes forming a rechargeable battery cell configured to be charged by the charge storage unit.

Optionally, the step of forming the at least one first discharging protrusions includes forming at least one first discharging tips, and the step of forming the at least one second discharging protrusions includes forming at least one second discharging tips. Optionally, the at least one second discharging tips are formed to be respectively opposed to the at least one first discharging tips. Optionally, the distance between a pair of corresponding first discharging tip and second discharging tip is in a range of approximately 10 µm to approximately 20 µm.

Optionally, the step of forming the conductive line layer includes forming a conductive strip layer including a conductive strip. Optionally, the conductive strip is a conductive adhesive strip. Optionally, the conductive strip is a metal strip.

Figure 5:
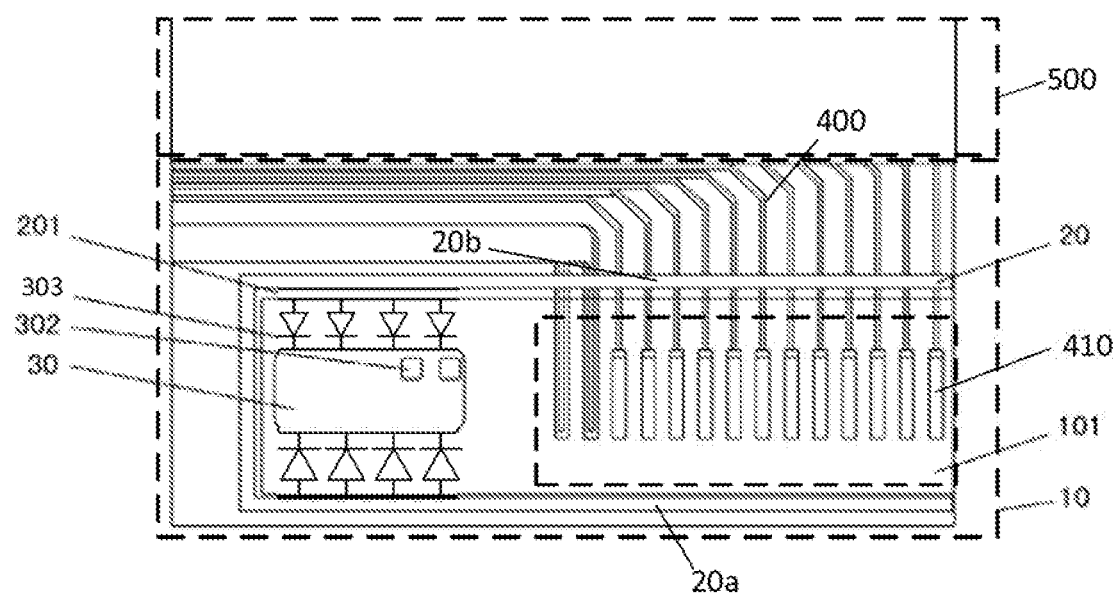
FIG. 5 is a zoom-in view of a driver integrated circuit bonding area of a display apparatus in some embodiments according to the present disclosure.

In some embodiments, the conductive line layer outputs electrostatic charges to the charge storage unit through at least one diodes. FIG. 5 is a zoom-in view of a driver integrated circuit bonding area of a display apparatus in some embodiments according to the present disclosure. Referring to FIG. 5, the conductive line layer in some embodiments includes a conductive line 20. The display apparatus further includes at least one diodes 303 arranged along the conductive line 20. Each of the at least one diodes 303 connects the conductive line 20 to the charge storage unit 30. The conductive line layer is configured to discharge electrostatic charges in the driver IC bonding area to the charge storage unit 30 through the at least one diode 303. The charge storage unit 30 is configured to receive an output from the at least one diodes 303 and to store charges received from the at least one diodes 303. Optionally, the at least one diodes 303 have a current direction that allows positive electrostatic charges to be outputted from the at least one diodes 303 to the charge storage unit 30 (as shown in FIG. 5), anodes of the at least one diodes 303 being electrically connected to the conductive line and cathodes of the at least one diodes 303 being electrically connected to the charge storage unit 30. Optionally, the at least one diodes 303 have a current direction that allows negative electrostatic charges to be outputted from the at least one diodes 303 to the charge storage unit 30, cathodes of the at least one diodes 303 being electrically connected to the conductive line and anodes of the at least one diodes 303 being electrically connected to the charge storage unit 30.

Figure 4:
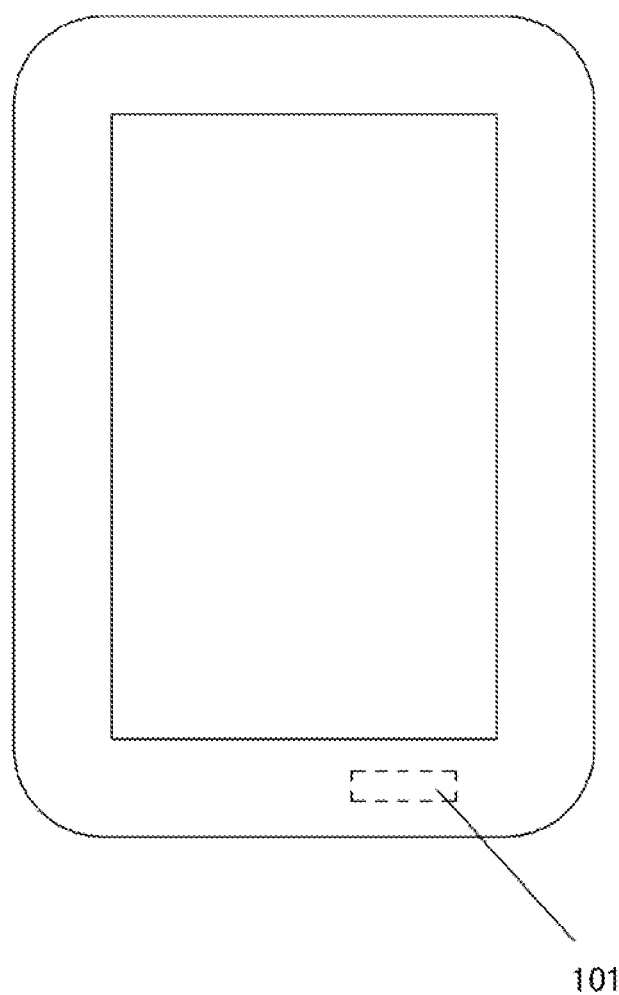
FIG. 4 is a diagram illustrating the structure of a display apparatus in some embodiments according to the present disclosure.

FIG. 4 is a diagram illustrating the structure of a display apparatus in some embodiments according to the present disclosure. Referring to FIG. 4, the display apparatus includes a driver IC bonding area 101. Optionally, the bonding area 101 is a touch driver IC bonding area. Optionally, the bonding area 101 is a gate line driver IC bonding area. Optionally, the bonding area 101 is a data line driver IC bonding area. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus having a driver integrated circuit (IC) bonding area for bonding a plurality of signal lines with a driver IC; the display apparatus comprising:
   a conductive line layer in a peripheral area of the display apparatus, configured to discharge electrostatic charge in the driver IC bonding area; and
   a signal line layer on a base substrate comprising a plurality of signal lines, terminals of which extend into the driver IC bonding area forming a plurality of bonding leads;
   wherein the conductive line layer comprising a conductive line, at least a portion of which is on a side of the plurality of bonding leads distal to a display area of the display apparatus
   a projection of the conductive line on the base substrate substantially surrounds that of the plurality of bonding leads; and
   a portion of the conductive line crosses over and is insulated from a plurality of signal lines on a side of the plurality of bonding leads proximal to the display area.

2. The display apparatus of claim 1, wherein the conductive line layer comprising a conductive line; and
   the conductive line comprises at least one first discharging protrusions arranged along the conductive line.

3. The display apparatus of claim 1, further comprising a charge storage unit coupled with the conductive line layer for storing electrostatic charges from the conductive line layer.

4. The display apparatus of claim 3, further comprising at least one diodes;
   wherein the conductive line layer comprising a conductive line;
   the at least one diodes arranged along the conductive line; each of the at least one diodes connecting the conductive line to the charge storage unit; and
   the charge storage unit is configured to receive an output from the at least one diodes and to store charges received from the at least one diodes.

5. The display apparatus of claim 3, wherein the charge storage unit comprises at least one second discharging protrusions on a surface of the charge storage unit.

6. The display apparatus of claim 5, wherein the conductive line layer comprising a conductive line;
   the conductive line comprises at least one first discharging protrusions arranged along the conductive line; and
   the at least one second discharging protrusions are configured to receive electrostatic charges from the plurality of first discharging protrusions.

7. The display apparatus of claim 6, wherein the at least one first discharging protrusions and the at least one second discharging protrusions are in a same layer.

8. A display apparatus having a driver integrated circuit (IC) bonding area for bonding a plurality of signal lines with a driver IC; the display apparatus comprising:
   a conductive line layer in a peripheral area of the display apparatus, configured to discharge electrostatic charge in the driver IC bonding area; and
   a charge storage unit coupled with the conductive line layer for storing electrostatic charges from the conductive line layer;
   wherein the charge storage unit comprises at least one second discharging protrusions on a surface of the charge storage unit the conductive line layer comprising a conductive line;
   the conductive line comprises at least one first discharging protrusions arranged along the conductive line;
   the at least one second discharging protrusions are configured to receive electrostatic charges from the plurality of first discharging protrusions; and
   the at least one first discharging protrusions and the at least one second discharging protrusions are in two different layers.

9. The display apparatus of claim 6, wherein the at least one second discharging protrusions are disposed respectively opposed to the at least one first discharging protrusions.

10. The display apparatus of claim 9, wherein the conductive line comprises a plurality of first discharging protrusions arranged along a longitudinal direction of the conductive line;
    the charge storage unit comprises a plurality of second discharging protrusions on the surface of the charge storage unit; and
    the plurality of second discharging protrusions are disposed respectively opposed to the plurality of first discharging protrusions.

11. The display apparatus of claim 3, wherein the charge storage unit is a capacitor.

12. The display apparatus of claim 11, comprising a gate line layer and a data line layer;

wherein a first capacitive plate of the capacitor is in a same layer as the gate line layer; and
a second capacitive plate of the capacitor is in a same layer as the data line layer.

13. The display apparatus of claim 3, wherein the charge storage unit is configured to charge a light emitting diode or a rechargeable battery cell.

14. The display apparatus of claim 6, wherein the at least one first discharging protrusions are at least one first discharging tips, and the at least one second discharging protrusions are at least one second discharging tips; and
the at least one second discharging tips are disposed respectively opposed to the at least one first discharging tips.

15. A display apparatus having a driver integrated circuit (IC) bonding area for bonding a plurality of signal lines with a driver IC; the display apparatus comprising:
a conductive line layer in a peripheral area of the display apparatus, configured to discharge electrostatic charge in the driver IC bonding area; and
a charge storage unit coupled with the conductive line layer for storing electrostatic charges from the conductive line layer;
wherein the charge storage unit comprises at least one second discharging protrusions on a surface of the charge storage unit;
the conductive line layer comprising a conductive line;
the conductive line comprises at least one first discharging protrusions arranged along the conductive line;
the at least one second discharging protrusions are configured to receive electrostatic charges from the plurality of first discharging protrusions;
the at least one first discharging protrusions are at least one first discharging tips, and the at least one second discharging protrusions are at least one second discharging tips;
the at least one second discharging tips are disposed respectively opposed to the at least one first discharging tips; and
a distance between a pair of corresponding first discharging tip and second discharging tip is in a range of approximately 10 μm to approximately 20 μm.

16. The display apparatus of claim 1, wherein the conductive line layer is a conductive strip layer comprising a conductive strip.

* * * * *